United States Patent
Yoo

(10) Patent No.: US 8,553,477 B2
(45) Date of Patent: Oct. 8, 2013

(54) DATA INTERFACE CIRCUIT, NONVOLATILE MEMORY DEVICE INCLUDING THE SAME AND OPERATING METHOD THEREOF

(75) Inventor: Byoung-Sung Yoo, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 213 days.

(21) Appl. No.: 13/102,823

(22) Filed: May 6, 2011

(65) Prior Publication Data

US 2012/0218839 A1    Aug. 30, 2012

(30) Foreign Application Priority Data

Feb. 28, 2011    (KR) .......................... 10-2011-0017617

(51) Int. Cl.
*G11C 7/10*    (2006.01)
(52) U.S. Cl.
USPC .............. 365/189.17; 365/233.1; 365/189.05
(58) Field of Classification Search
USPC .............. 365/189.17, 233.1, 189.05, 189.02, 365/193, 230.03, 194, 189.11, 220, 221, 365/189.18, 189.07, 185.23, 230.06
See application file for complete search history.

(56) References Cited

U.S. PATENT DOCUMENTS

| | | | | |
|---|---|---|---|---|
| 2005/0232033 A1* | 10/2005 | Cha | ............................ | 365/193 |
| 2006/0245278 A1* | 11/2006 | Lee et al. | .................... | 365/193 |

FOREIGN PATENT DOCUMENTS

| KR | 100303780 | 9/2001 |
|---|---|---|
| KR | 1020040093892 | 11/2004 |
| KR | 1020080088172 | 10/2008 |
| KR | 1020090092672 | 9/2009 |

OTHER PUBLICATIONS

Office Action issued by the Korean intellectual Property Office on Aug. 13, 2012.

* cited by examiner

*Primary Examiner* — Dang Nguyen
(74) *Attorney, Agent, or Firm* — IP & T Group LLP

(57) ABSTRACT

A data interface unit is used in a semiconductor memory device and includes a data alignment unit configured to separate consecutive input data into rising data and falling data, and a data transfer unit configured to selectively transfer the rising data and falling data to an even column line and an odd column line in response to a start column address.

17 Claims, 3 Drawing Sheets

DATA INTERFACE CIRCUIT, NONVOLATILE MEMORY DEVICE INCLUDING THE SAME AND OPERATING METHOD THEREOF

CROSS-REFERENCE TO RELATED APPLICATIONS

The present application claims priority of Korean Patent Application No. 10-2011-0017617, filed on Feb. 28, 2011, which is incorporated herein by reference in its entirety.

BACKGROUND

1. Field

Exemplary embodiments of the present invention relate to a semiconductor design technology, and more particularly, to a data interface circuit, a nonvolatile memory device including the same and operating method thereof.

2. Description of the Related Art

In general, semiconductor memory devices are classified as a volatile memory device or a nonvolatile memory device according to whether or not data are preserved when a power supply is cut off. The nonvolatile memory device may have both advantages of a random access memory (RAM), which can freely record and erase data, and advantages of a read only memory (ROM), which can retain stored data without supply of power. In particular, because the degree of integration of a nonvolatile memory device, such as a flash memory, is relatively easier to increase, nonvolatile memory devices have recently been adopted to various fields requiring storage of mass data.

In a conventional nonvolatile memory device, because it takes a significant amount of time to write data to a memory cell or read the written data, a single data rate (SDR) mechanism for inputting/outputting data in synchronization with a rising edge or a falling edge of a clock signal is not given much weight in a total performance of the memory device. However, as a speed for reading/writing data increases, e.g., a size of a page buffer increases up to 8K Byte from 1K Byte, the total performance of the memory device depends more heavily upon the SDR mechanism. To improve the total performance of the memory device, a double data rate (DDR) for inputting/outputting data in synchronization with both a rising edge and a falling edge of a clock signal has been introduced.

FIG. 1 is a block diagram showing a configuration of a conventional nonvolatile memory device.

Referring to FIG. 1, the conventional nonvolatile memory device comprises a memory cell array 101, a page buffer unit 103, a column decoder 105, an address counter 107, a row decoder 109, and a control logic 111.

Hereafter, a program operation for storing data in the conventional nonvolatile memory device will be illustrated.

First, a command CMD, a row address RA, and a start column address CA are inputted to the nonvolatile memory device through input/output (I/O) lines (not shown). Here, the start column address CA is a column address when data are inputted at a first time. Since the nonvolatile memory device generally receives and outputs data on a page-by-page basis, addresses may be generated by sequentially increasing the start column address CA after the start column address CA is inputted, and then the generated addresses may be allocated to consecutive input data.

The row decoder 109 receives the row address RA and activates one of a plurality of word lines WL, which corresponds to the row address RA. The address counter 107 generates a count column address CA_CNT by sequentially increasing the start column address CA. The column decoder 105 loads input data DIN on the page buffer unit 103 through a plurality of data lines DL corresponding to the count column address CA_CNT. The loaded input data DIN is transferred to one of a plurality of bit lines BL, which corresponds to the count column address CA_CNT, so as to be stored in a memory cell among the memory cell array 101, which is selected by the activated word line WL and the bit line BL corresponding to the count column address CA_CNT. The control logic 111 receives the command CMD to control operations of components such as the page buffer unit 103, the column decoder 105, the address counter 107, and the row decoder 109.

FIG. 2 is a timing diagram depicting a data input operation of the conventional nonvolatile memory device shown in FIG. 1 according to a DDR method.

Referring to FIG. 2, the nonvolatile memory device according to the DDR method receives input data DIN in synchronization with rising and falling edges of an internal clock CLK. That is, the data input operation according to the DDR method is performed in pairs at each rising and falling edge of the internal clock CLK. Accordingly, the input data DIN inputted to the nonvolatile memory device are classified into rising data D0, D2, D4, . . . , which are inputted in synchronization with the rising edge of the internal clock CLK, and falling data D1, D3, D5, . . . , which are inputted in synchronization with the falling edge of the internal clock CLK. The nonvolatile memory device according to the DDR method may perform the data input operation at a high speed by inputting the above rising and falling data in different data lines. In detail, the rising data are transferred to an even data line DL_EV while the falling data are transferred to an odd data line DL_OD.

Furthermore, since a pair of the rising and falling data is processed during one period of the internal clock CLK, a column address is classified into an even column address and an odd column address. That is, a pair of the even and odd column addresses is generated during one period of the internal clock CLK. At this time, the address counter 107 generates the count column address CA_CNT by sequentially increasing the start column address CA by 2 whenever the internal clock CLK is toggled. Accordingly, the even column address is allocated to the rising data D0, D2, D4, . . . , and the odd column address is allocated to the falling data D1, D3, D5, . . . .

Meanwhile, the conventional nonvolatile memory device according to the DDR method may allocate an even column address to a first data, which is inputted at the first time, and transfers the first data to an even data line. Then, the conventional nonvolatile memory device may allocate an odd column address to a second data, which is inputted subsequent to the first data, and transfers the second data to an odd data line. That is, since the even column address may be fixed to be allocated to the first data which is inputted at the first time, the conventional nonvolatile memory device may have difficulty randomly inputting/outputting the data.

SUMMARY

Exemplary embodiments of the present invention are directed to a data interface circuit, a nonvolatile memory device including the same, and an operating method that is capable of randomly accessing data while inputting/outputting the data according to a DDR method.

In accordance with an exemplary embodiment of the present invention, a data interface unit includes a data alignment unit configured to separate consecutive input data into rising data and falling data, and a data transfer unit configured to selectively transfer the rising data and the falling data to an even column line and an odd column line in response to a start column address.

In accordance with another exemplary embodiment of the present invention, a nonvolatile memory device includes a memory cell array configured to store data, a page buffer unit including a plurality of page buffers coupled to the memory cell array, an address counter configured to generate a count column address by sequentially increasing a start column address, a data interface unit configured to separate consecutive input data into rising data and falling data, and to selectively transfer the rising data and falling data to an even column line and an odd column line in response to the start column address, and a column decoder configured to provide the rising data and falling data, which are transferred through the even column line and the odd column line, to the page buffer corresponding to the count column address.

In accordance with yet another exemplary embodiment of the present invention, a method for operating a nonvolatile memory device includes generating a count column address by sequentially increasing a start column address, separating consecutive input data into rising data and falling data, selectively transferring the rising data and falling data to an even column line and an odd column line in response to the start column address, and storing the rising data and falling data, which are transferred through the even column line and the odd column line, into a memory cell in response to the count column address.

DETAILED DESCRIPTION

Figure 1:
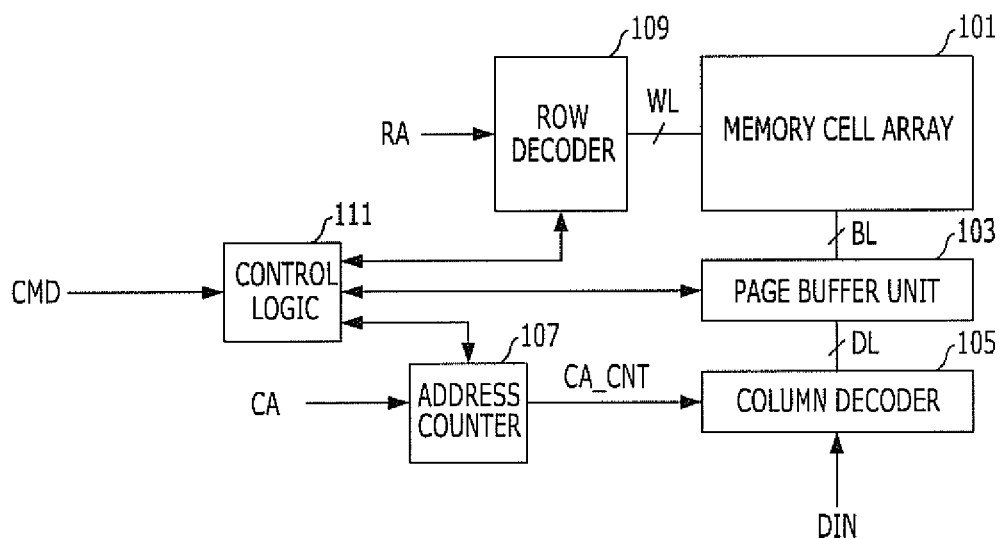
FIG. 1 is a block diagram showing a configuration of a conventional nonvolatile memory device.
Figure 2:
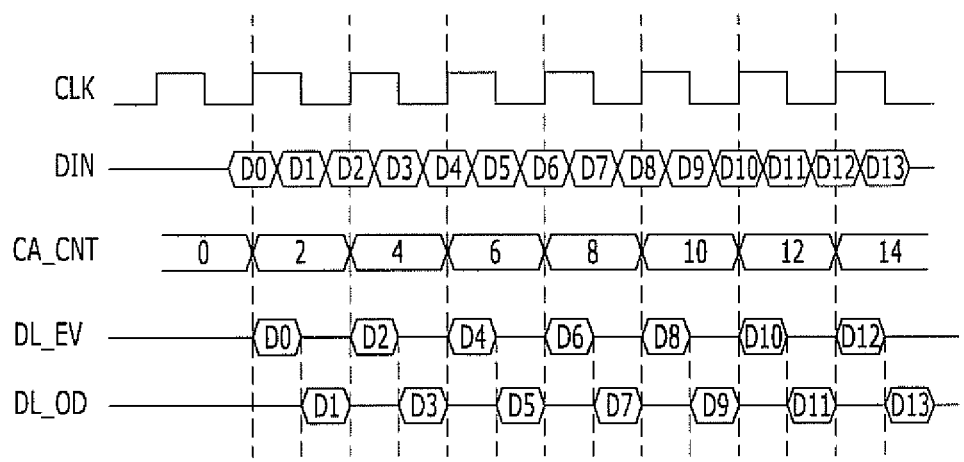
FIG. 2 is a timing diagram depicting a data input operation of the conventional nonvolatile memory device shown in FIG. 1 according to a known DDR method.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
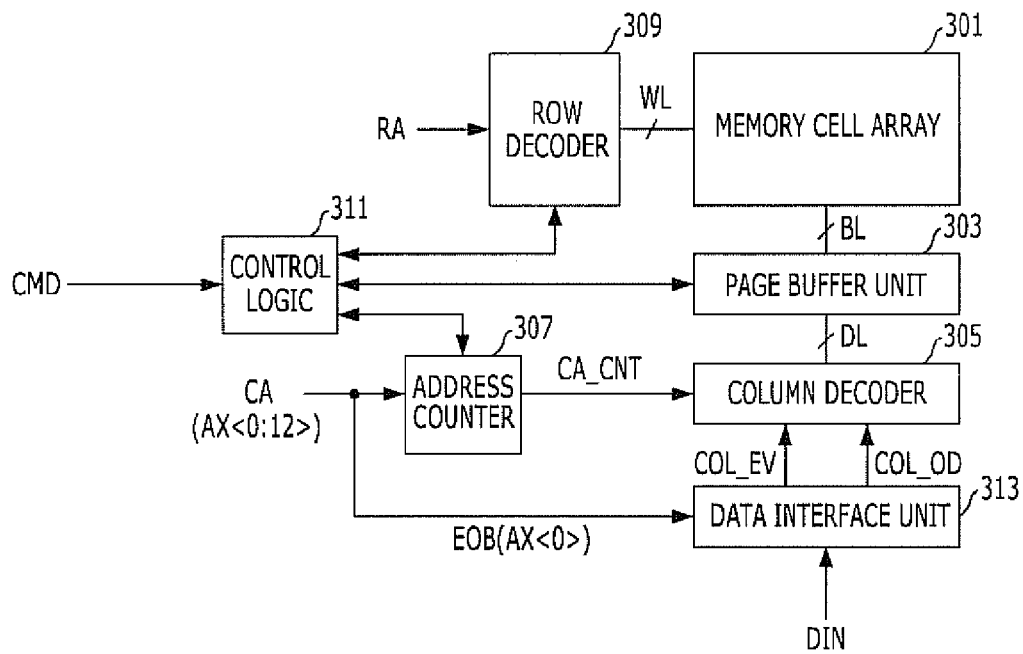
FIG. 3 is a block diagram showing a nonvolatile memory device in accordance with an exemplary embodiment of the present invention.

FIG. 3 is a block diagram showing a nonvolatile memory device in accordance with an exemplary embodiment of the present invention.

Referring to FIG. 3, the nonvolatile memory device in accordance with the exemplary embodiment of the present invention includes a memory cell array 301, a page buffer unit 303, a column decoder 305, an address counter 307, and a data interface unit 313.

The memory cell array 301 is configured to store data. The page buffer unit 303 includes a plurality of page buffers, each of which is coupled between a plurality of bit lines BL coupled to the memory cell array 301 and a plurality of data lines DL, and serves to store data to the memory cell array 301 or read the stored data from the memory cell array 301. The address counter 307 is configured to generate a count column address CA_CNT by sequentially increasing a start column address CA. The data interface unit 313 is configured to assign consecutive input data DIN into rising data RDATA and falling data FDATA, and to selectively transfer the rising data RDATA and falling data FDATA to an even column line COL_EV and an odd column line COL_OD in response to the start column address CA. The column decoder 305 is configured to load the rising data RDATA and falling data FDATA, which are transferred through the even column line COL_EV and the odd column line COL_OD, on the page buffer corresponding to the count column address CA_CNT.

The nonvolatile memory device further includes a row decoder 309 and a control logic 311. The row decoder 309 is configured to receive a row address RA and to activate one of a plurality of word lines WL, which corresponds to the row address RA. The control logic 311 is configured to receive a command CMD to control operations of components included in the nonvolatile memory device.

Since the nonvolatile memory device in accordance with the exemplary embodiment operates according to the DDR method, the nonvolatile memory device receives and outputs data in synchronization with both rising and falling edges of an internal clock CLK. The rising data RDATA denotes data synchronized with the rising edge of the internal clock CLK, and the falling data FDATA denotes data synchronized with the falling edge of the internal clock CLK.

The start column address CA is a column address at a start point of inputting/outputting data, and includes a multi-bit address signal AX<0:12>. By using a predetermined bit, e.g., a first bit AX<0> of the address signal AX<0:12>, the nonvolatile memory device in accordance with the exemplary embodiment may determined whether a polarity of a column where data start to be inputted/outputted is even or odd. Hereinafter, this predetermined bit, e.g., AX<0>, used in determining the polarity of the column where the data start to be inputted/outputted, can be referred to as a column determination bit EOB.

Figure 4:
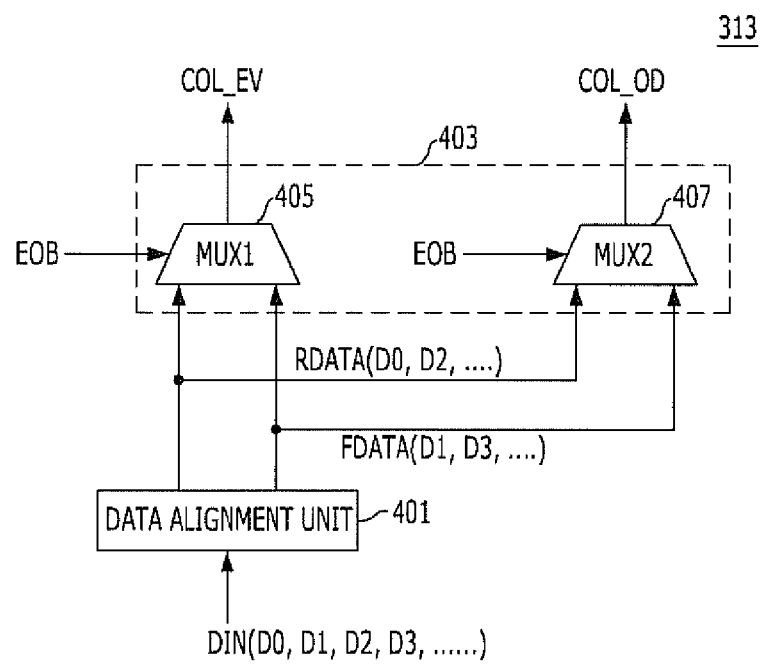
FIG. 4 is a block diagram showing a data interface unit shown in FIG. 3 in more detail.

FIG. 4 is a block diagram showing the data interface unit 313 shown in FIG. 3 in more detail.

Referring to FIG. 4, the data interface unit 313 includes a data alignment unit 401 and a data transfer unit 403. The data alignment unit 401 is configured to classify/assign consecutive input data DIN as the rising data RDATA and the falling data FDATA. The data transfer unit 403 is configured to selectively transfer the rising data RDATA and the falling data FDATA to the even column line COL_EV and the odd column line COL_OD in response to the start column address CA. Here, the data transfer unit 403 may include first and second selection units 405 and 407.

The data alignment unit 401 classifies/assigns the consecutive input data DIN as the rising data RDATA and the falling data FDATA, and transfers the rising data RDATA and the falling data FDATA to the first and second selection units 405 and 407 of the data transfer unit 403. That is, the data alignment unit 401 divides the consecutive input data DIN, e.g., D0, D1, D2, D3, . . . , into the rising data RDATA, e.g., D0, D2, . . . , which are synchronized with the rising edge of the internal clock CLK, and the falling data FDATA, e.g., D1, D3, . . . , which are synchronized with the falling edge of the internal clock CLK, and transfers the rising data RDATA and the falling data FDATA to both of the first and second selection units 405 and 407 through the different data lines. The first and second selection units 405 and 407 may be implemented by using a multiplexer.

The data transfer unit 403 transfers the rising data RDATA to one of the even column line COL_EV and the odd column line COL_OD, and transfers the falling data FDATA to the other of the even column line COL_EV and the odd column line COL_OD in response to the column determination bit FOB among the multi-bit column signal AX<0:12> constituting the start column address CA. For example, when the column determination bit EOB is a logic low level, i.e., the start column address CA is even, the data transfer unit 403 transfers the rising data RDATA through the multiplexer 405 to the even column line COL_EV while transferring the falling data FDATA through the multiplexer 407 to the odd column line COL_OD. When the column determination bit EOB is a logic high level, i.e., the start column address CA is odd, the data transfer unit 403 transfers the rising data RDATA through the multiplexer 407 to the odd column line COL_OD while transferring the falling data FDATA through the multiplexer 405 to the even column line COL_EV.

Figure 5:
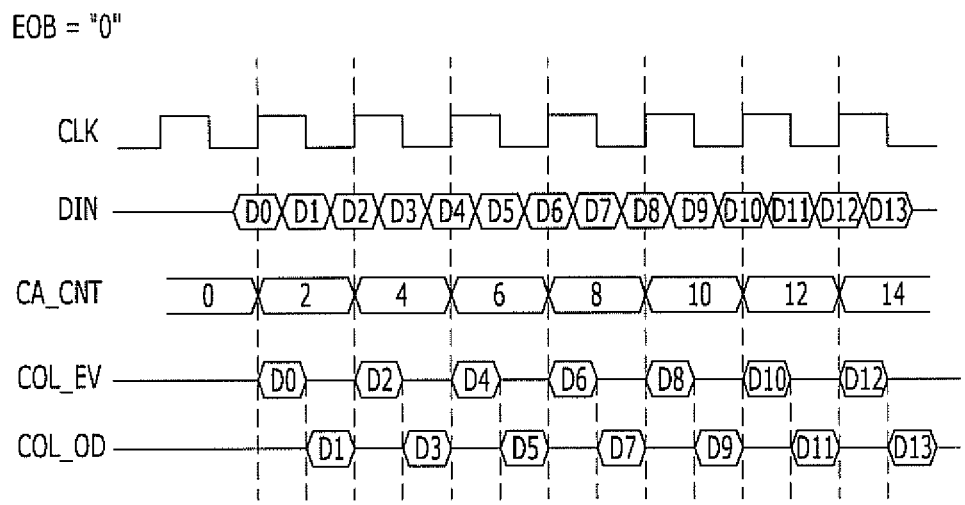
FIG. 5 is a timing diagram illustrating an operation of a nonvolatile memory device in accordance with an exemplary embodiment of the present invention when a start column address is even.
Figure 6:
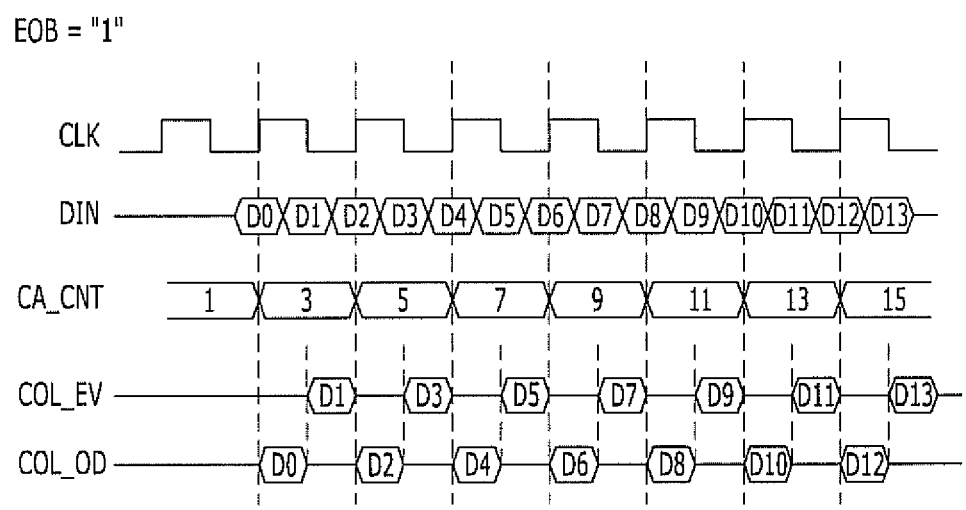
FIG. 6 is a timing diagram illustrating an operation of a nonvolatile memory device in accordance with an exemplary embodiment of the present invention when a start column address is odd.

FIG. 5 is a timing diagram illustrating an operation of a nonvolatile memory device when the start column address CA is even, and FIG. 6 is a timing diagram illustrating an operation of a nonvolatile memory'device when the start column address CA is odd.

Referring to FIG. 5, the start column address CA is even, and thus the column determination bit EOB becomes a logic low level, i.e., AX<0>="0". The address counter 307 generates the count column address CA_CNT by sequentially increasing the start column address CA by 2 from '0' whenever the internal clock CLK is toggled. As a result, the count column address CA_CNT is sequentially increased in the order of 0, 2, 4, 6, 8, etc. The data interface unit 313 classifies/assigns the consecutive input data DIN as the rising data D0, D2, D4, . . . , and the falling data D1, D3, D5, . . . , and selectively transfers the rising data D0, D2, D4, . . . , and the falling data D1, D3, D5, . . . to the even column line COL_EV and the odd column line COL_OD, respectively. The column decoder 305 allocates even/odd column addresses such as 2/3, 4/5, 6/7, . . . , to the rising data D0, D2, D4, . . . , and the falling data D1, D3, D5, which are transferred through the even column line COL_EV and the odd column line COL_OD, respectively. The page buffer unit 303 stores the rising data D0, D2, D4, . . . , and the falling data D1, D3, D5, . . . to the memory cell array 301 transferred through the data lines DL.

Referring to FIG. 6, the start column address CA is odd, and thus the column determination bit EOB becomes a logic high level, i.e., AX<0>="1". The address counter 307 generates the count column address CA_CNT by sequentially increasing the start column address CA by 2 from '1' whenever the internal clock CLK is toggled. Herein, the count column address CA_CNT is sequentially increased in the order of 1, 3, 5, 7, 9, etc. The data interface unit 313 selectively transfers the rising data D0, D2, D4, . . . , and the falling data D1, D3, D5, . . . to the odd column line COL_OD and the even column line COL_EV, respectively. The column decoder 305 allocates odd/even column addresses such as 3/4, 5/6, 7/8, . . . , to the rising data D0, D2, D4, . . . , and the falling data D1, D3, D5, which are transferred through the odd column line COL_OD and the even column line COL_EV, respectively. The page buffer unit 303 stores the rising data D0, D2, D4, . . . , and the falling data D1, D3, D5, . . . to the memory cell array 301 transferred through the data lines DL.

In a data input/output operation according to a DDR method, the conventional nonvolatile memory device has to allocate the start column address CA to an even value. In contrast, the nonvolatile memory device in accordance with the exemplary embodiment may randomly access data during the data input/output operation according to the DDR method, as described in FIGS. 5 and 6.

Meanwhile, the page buffer unit 303 may include a plurality of page buffers corresponding to the column address CA. The data lines DL between the page buffer unit 303 and the column decoder 305 may have a plurality of even data lines corresponding to an even column address of the count column address CA_CNT, and a plurality of odd data lines corresponding to an odd column address of the count column address CA_CNT. At this time, the column decoder 305 may load data transferred through the even column line COL_EV on a respective page buffer through the even data lines, and may load data transferred through the odd column line COL_OD on a respective page buffer through the odd data lines.

Further, the memory cell array 301 is coupled to the row decoder 309 through the plurality of word lines WL, and coupled to the page buffer unit 303 through the plurality of bit lines BL. Data loaded on each page unit included in the page buffer unit 303 are transferred to the memory cell array 301 through the respective bit lines BL to be stored in a page corresponding to a respective one of the word lines WL, which is activated in response to the row address RA.

According to an exemplary embodiment of the present, a nonvolatile memory device may allocate a start column address to either an even column address or an odd column address. Thus, the nonvolatile memory device may randomly access data while inputting/outputting the data according to a DDR method.

While the present invention has been described with respect to the specific embodiments, it will be apparent to those skilled in the art that various changes and modifications may be made without departing from the spirit and scope of the invention as defined in the following claims.

What is claimed is:

1. A data interface circuit comprising:
    a data alignment unit configured to separate consecutive input data into rising data and falling data; and
    a data transfer unit configured to selectively transfer the rising data and the falling data to an even column line and an odd column line in response to a start column address, wherein the data transfer unit transfers the rising data to the odd column line and transfers the falling data to the even column line when the start column address is odd.

2. The data interface circuit of claim 1, wherein the rising data includes data from among the input data which is inputted in synchronization with a rising edge of an internal clock; and the falling data includes data from among the input data which is inputted in synchronization with a falling edge of the internal clock.

3. The data interface circuit of claim 1, wherein the data transfer unit transfers the rising data to one of the even column line and the odd column line, and transfers the falling data to the other of the even column line and the odd column line in response to a particular bit of the start column address.

4. The data interface circuit of claim 1, wherein the data transfer unit transfers the rising data to the even column line and transfers the falling data to the odd column line when the start column address is even.

5. A nonvolatile memory device comprising:
- a memory cell array configured to store data;
- a page buffer unit including a plurality of page buffers coupled to the memory cell array;
- an address counter configured to generate a count column address by sequentially increasing a start column address;
- a data interface unit configured to separate consecutive input data into rising data and falling data, and to selectively transfer the rising data and falling data to an even column line and an odd column line in response to the start column address, wherein the data interface unit transfers the rising data to the odd column line and transfers the falling data to the even column line when the start column address is odd; and
- a column decoder configured to provide the rising data and falling data, which are transferred through the even column line and the odd column line, to the page buffer corresponding to the count column address.

6. The nonvolatile memory device of claim 5, wherein the rising data includes data from among the input data which is inputted in synchronization with a rising edge of an internal clock; and the falling data includes data from among the input data which is inputted in synchronization with a falling edge of the internal clock.

7. The nonvolatile memory device of claim 5, wherein the data interface unit includes:
- a first data selection unit configured to transfer the rising data to one of the even column line and the odd column line in response to a particular bit of the start column address; and
- a second data selection unit for transfer the rising data to the other of the even column line and the odd column line in response to the particular bit.

8. The nonvolatile memory device of claim 7, wherein the first and second data selection units include a multiplexer.

9. The nonvolatile memory device of claim 5, wherein the data interface unit transfers the rising data to the even column line and transfers the falling data to the odd column line when the start column address is even.

10. The nonvolatile memory device of claim 5, wherein the page buffer unit is coupled to the column decoder through a plurality of data lines which comprise a plurality of even data lines corresponding to an even column address of the count column address, and a plurality of odd data lines corresponding to an odd column address of the count column address.

11. The nonvolatile memory device of claim 10, wherein the column decoder provides data transferred through the even column line to a respective page buffer through the even data lines, and provides data transferred through the odd column line to a respective page buffer through the odd data lines.

12. The nonvolatile memory device of claim 5, wherein the address counter generates the count column address by sequentially increasing the start column address by 2 whenever an internal clock is toggled.

13. A method for operating a nonvolatile memory device, the method comprising:
- generating a count column address by sequentially increasing a start column address;
- separating consecutive input data into rising data and falling data;
- selectively transferring the rising data and falling data to an even column line and an odd column line in response to the start column address, wherein the rising data is transferred to the odd column line and the falling data is transferred to the even column line when the start column address is odd; and
- storing the rising data and falling data, which are transferred through the even column line and the odd column line, into a memory cell in response to the count column address.

14. The method of claim 13, wherein the rising data are transferred to one of the even column line and the odd column line, and the falling data are transferred to the other of the even column line and the odd column line in response to a particular bit of the start column address.

15. The method of claim 13, wherein the even column line corresponds to an even column address, and the odd column line corresponds to an odd column address.

16. The method of claim 13, wherein the rising data is transferred to the even column line and the falling data is transferred to the odd column line when the start column address is even.

17. The method of claim 13, wherein the generating of the count column address by sequentially increasing the start column address comprises increasing the start column address by 2 whenever an internal clock is toggled.

* * * * *